United States Patent [19]

Longini

[11] Patent Number: 5,061,890
[45] Date of Patent: Oct. 29, 1991

[54] METHOD AND APPARATUS FOR DIGITALLY MEASURING ELECTRICAL ENERGY CONSUMPTION

[76] Inventor: Richard L. Longini, 6731 Forest Glen Rd., Pittsburgh, Pa. 15217

[21] Appl. No.: 514,255

[22] Filed: Apr. 25, 1990

Related U.S. Application Data

[63] Continuation-in-part of Ser. No. 390,234, Aug. 7, 1989.

[51] Int. Cl.[5] ............... G01R 19/00; G01R 21/00
[52] U.S. Cl. ..................... 324/107; 324/103 R; 324/142; 364/483
[58] Field of Search ............... 324/107, 142, 103 R, 324/117 R; 364/569, 576, 577, 481, 483, 485, 487

[56] References Cited

U.S. PATENT DOCUMENTS

| | | | |
|---|---|---|---|
| 3,466,431 | 9/1969 | Fuchs | 364/576 |
| 4,261,038 | 4/1981 | Johns et al. | 364/576 |
| 4,491,790 | 1/1985 | Miller | 324/107 |
| 4,617,636 | 10/1986 | John et al. | 364/482 |
| 4,709,339 | 11/1987 | Fernandes | 364/483 |
| 4,744,041 | 5/1988 | Stump et al. | 364/565 |
| 4,878,142 | 10/1989 | Bergman et al. | 364/483 |
| 4,904,945 | 2/1990 | Kouan et al. | 364/483 |
| 4,964,055 | 10/1990 | Grassel et al. | 324/77 B |

OTHER PUBLICATIONS

"A Feedback Model for Automated Real Estate Assessment", by Carbone et al, Mgmt. Science, vol. 24, #3, 11/77, pp. 241–248.
"A Summary of Research and Application of a Feedback Corrected System for Calculating Fourier Coefficients and Data Predic.", by Chidossi, 5/79.

Primary Examiner—Kenneth A. Wieder
Assistant Examiner—William J. Burns
Attorney, Agent, or Firm—Carothers & Carothers

[57] ABSTRACT

A method and apparatus for digitally measuring electrical energy consumption from a transmission line carrying alternating current. Instead of actually measuring current from a transmission line conductor, the time derivative of the magnetic field induced by current flowing in the conductor is measured thereby obtaining a reading which is proportional to the time derivative of the current flow. Using an appropriate microcomputer, the time derivative of the magnetic field (the magnetic field rate of change) is represented with an algorithmic series for expressing cyclic phenomena, such as the Fourier series of low order. An approximation of the power consumption is then computed by converting the time derivative of the current as expressed in the algorithmic series and a voltage measurement from the conductor mathematically to a power reading, and the power reading is summed to obtain a number value proportional to the energy consumption. Even harmonics and high frequency harmonics may be eliminated in the algorithmic expression of the current derivative to further simplify computer computations and required hardware, and the magnetic rate of change pickup and the voltage pickup are preferably filtered to remove unwanted noise.

47 Claims, 2 Drawing Sheets

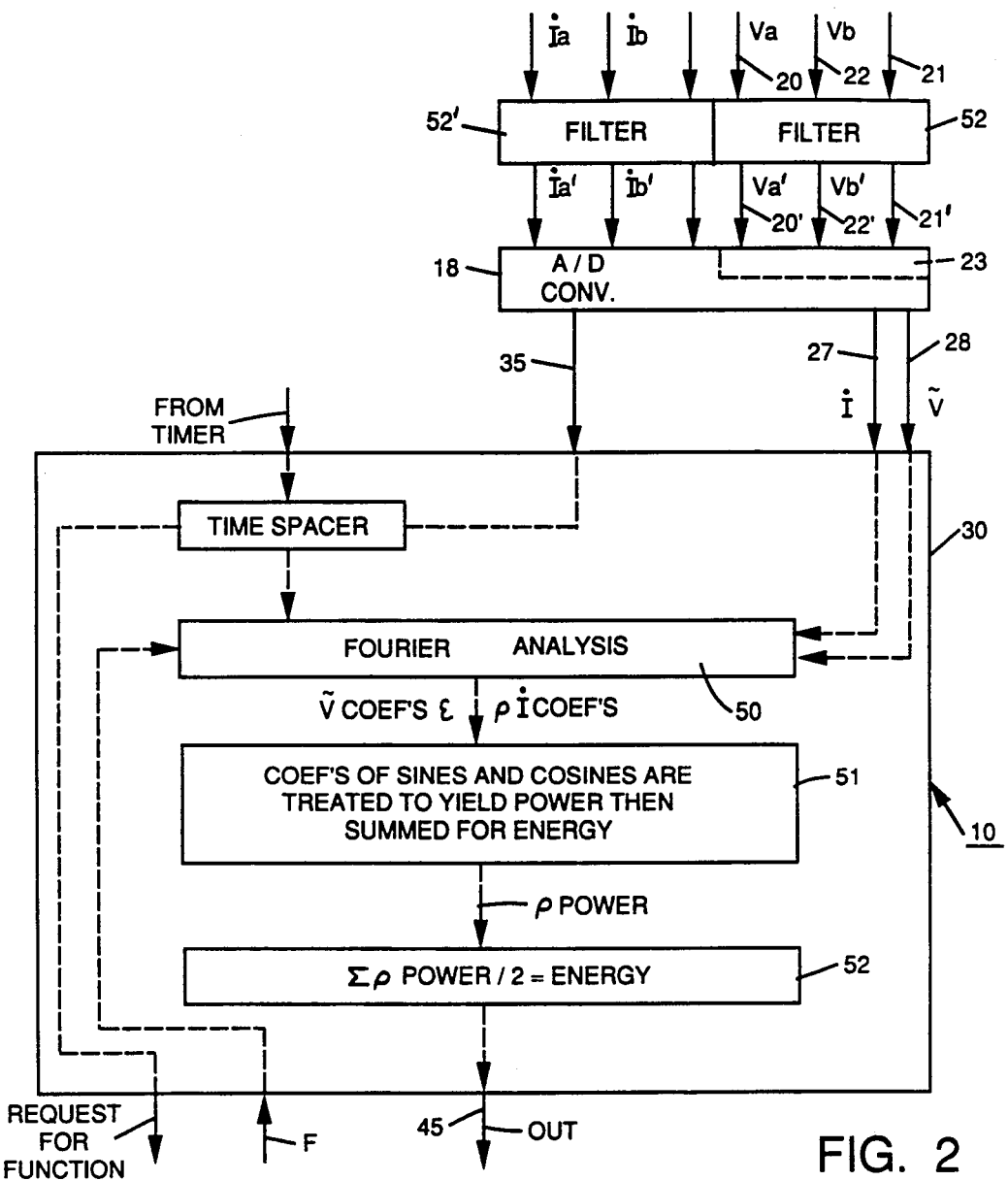
FIG. 2
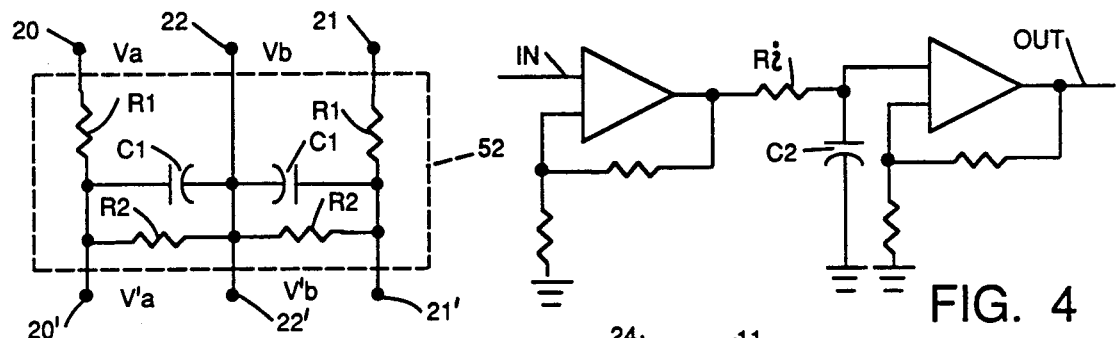
FIG. 3
FIG. 4
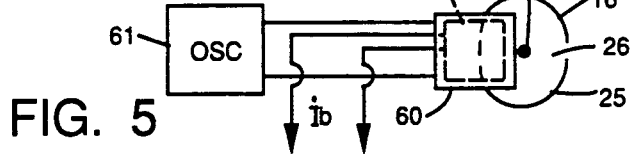
FIG. 5

METHOD AND APPARATUS FOR DIGITALLY MEASURING ELECTRICAL ENERGY CONSUMPTION

CROSS REFERENCE

The present application is a continuation-in-part of application Ser. No. 390,234 filed on Aug. 7, 1989.

BACKGROUND OF THE INVENTION

This invention relates generally to a digital energy meter and, more particularly, to an improved digital electrical energy consumption meter which does not require the actual measurement of instantaneous current in order to obtain power consumption measurements of more than adequate accuracy.

The present invention pertains to the measurement of energy consumed by a load connected to an electrical transmission line that in turn is connected to an alternating current source or supply. Typical examples might be the supply of alternating current to a home or resident in the form of single phase alternating current, or to a commercial or industrial user in the form of a multiple phase alternating current supply.

The present invention further relates to the art of digital electrical power consumption meters which are desirable in general because an effective digital meter should normally provide a greater accuracy of measurement with less expensive manufacturing and the capability of easy remote reading of power consumption many miles from the meter by transmitting the digital information via radio waves or telephone lines or the like.

The voltage supply varies sinusoidally, approximately, with time. However the delivered current varies in time depending upon the nature of the load and the controls which regulate the load. For example, the current may be sinusoidal if the load consists of a heating element with some inductive characteristics. The current wave form will usually not match the voltage wave form instant by instant, but will be delayed slightly giving rise to a phase shift of current with respect to voltage. In addition nonsinusoidal current wave forms will result from certain load controls such as semiconductor controls, semiconductor light dimmers, for example.

Instantaneous power is the current multiplied by the voltage at any instant. The effective power is the integral of the instantaneous power over time, divided by the time over which the integration takes place. Digital type meters presently known deduce this from instantaneous power measurements. Energy consumption meters (watt hour meters) yield the integral of the power over time, or just the integral of instantaneous power over time, without the division mentioned above.

In power measurement procedures, prior art digital meters measure current and voltage separately, yet simultaneously, and multiply the current and voltage values to provide instantaneous power and then sum the results to give watt-hours. The values of voltage and current must each be digitized for this function. To achieve simultaneity the simple solution uses two digital to analog converters to make these two measurements of voltage and current thereby increasing the expense of manufacture.

Two difficulties of basic importance arise in implementation of known types of digital watt-hour meters. First, simultaneous readings of voltage and current are more costly than separately taken readings and it is obvious that cost must be kept to an absolute minimum when pertaining to meters that are going to be used in massive quantities. Second, the measurement of voltage is simple and very inexpensive, involving a simple resistor bridge or an equivalent, but current is measured on a line or conductor separated from a ground return line by a high voltage and direct readings of current are expensive.

The method and apparatus of the present invention eliminate these difficulties and provide a digital watt-hour meter of more than adequate accuracy which may be manufactured at acceptable cost.

SUMMARY OF THE INVENTION

The digital watt-hour meter of the present invention is all digital. Analog voltage and analog measurement of magnetic field change are converted to digital readings and made to yield direct kilowatt-hour or other desired energy consumption readings. No hardware integration of the rate of change of magnetic field is involved. Unlike exisiting digital meters and nondigital meters, the current or current derivative used or measured in the calculations for the meter of the present invention is not the true current or current derivative, but in fact is a mathematical approximation or pseudo current or current derivative which is an approximation to the true current or current derivative and is obtained by using an algorithmic series, such as the Fourier series, which has the capabilities of expressing cyclic phenomena and utilizes a series of functions that are probably orthogonal. While the Fourier series is presently known as the best way to represent this expression, it must be kept in mind that other cyclic and orthogonal expressions have been published and still others may be constructed by competent mathematicians and therefore the present invention should not be limited to the Fourier series as it may well be that other algorithmic series will be similarly acceptable.

To explain further, the current or current derivative used in the calculations of the meter of the present invention is not the true current, but, in fact, it is a mathematical approximation of the current or current derivative using an algorithmic series such as the Fourier series of low order. The voltage picked up from the magnetic field produced by the current in a line or conductor is proportional to the rate of change (time derivative) of current rather than to the current itself. This must be integrated if it is required to determine an approximation of the current itself. When a derivative is expressed as an algorithmic series, or as a Fourier series, which is the technique discussed in the detailed description of this invention, the integration or other calculations required to calculate energy consumption may be ultra-simple as will be seen hereinafter.

With regard to one embodiment of the method and apparatus of the present invention, the energy delivered can be expressed mathematically as the integral of the calculated instantaneous time derivative of the current times the simultaneously taken instantaneous voltage. This is a calculated or pseudo current and not the true instantaneous current. When each of these pseudo current readings are expressed as an algorithmic or Fourier series, it will be readily seen that all cross terms (between frequencies) in the product drop out. Furthermore, the voltage wave form, as delivered by the power company transformer remains nearly sinusoidal, not being grossly distorted by the various loads on the system. The distortion is normally far less than that of the current wave form. The voltage wave form is not expressed in an algorithmic or Fourier series for calculation purposes.

The voltage wave form usually contains only a small harmonic content and no direct current component. The even harmonics of power are usually considered to be low as they are the result of imbalance between the two halves of both the voltage and current wave forms. For the usual precision of the resultant meter, inclusion of even harmonics in the calculation of the current wave form is probaby unnecessary. The required precision of the resultant meter does not therefore necessarily require inclusion of even harmonics in calculation of the current wave form. The computations are clearly simplified if they are left out.

Also, because of the following considerations, no attempt need be made to duplicate the high frequency found in the current in many applications. One result of harmonic analysis is the understanding that cross terms in frequency between voltage and current do not result in power. Thus, because the high frequency components of voltages delivered by the utility are very much smaller, no high frequency components need be computed for the current wave form. If no high harmonics are needed in the current wave form, none are needed in the derivative wave form either. That is, the algorithmic or Fourier series describing the pickup voltage from derivative current reading need have no high harmonic content in spite of the high harmonic content frequently actually found in the derivative current voltage.

The algorithmic or Fourier series utilized as the basis for the present disclosure, is applicable to all cyclic phenomena for the purpose of expressing the same. In theory it is strictly correct only if the cyclic phenomena is infinitely long or cyclic over perscribed finite limits. With regard to the method and apparatus of the present invention, it is used in a manner with reference to perscribed finite limits, but not strictly. For example, a thirty-two or sixty-four reading cycle may be utilized and be considered a prescribed range. This may be used in a feedback technique to modify a previously determined series. At the start, of course, there exists no previous series. In that case it may be utilized directly to obtain coefficients of the algorithmic series representation as though a "previously determined series" had been zero. Instead of using an adjustment means for a previously determined series, new coefficients are determined after every 32 or 64 reading cycle. This "non-comparison" embodiment, while not being required, is unique and saves a considerable amount of computations and is therefore desirable.

A current series may easily be derived from a derivative current voltage series by integrating term by term. The integration of a Fourier series involves exchanging cosine for sine and minus sine for cosine and dividing by the harmonic number. Thus no real computation of any kind is needed in this integration. Thus, although the current per se might not be required, its value is readily available.

The voltage readings in this one example embodiment are not expressed in a series or algorithmic series, but can be thought of as a series with all components accurately determined. The product of current and voltage, therefore, can be thought of as that of two series even though one of the factors was never expressed as a series. The fact that the so called voltage series has many more terms than the current series is of no concern as missing components are identical to zero components and clearly the product of a non-zero voltage series component with a zero component of the current series yields zero.

When the analytic expression for current is obtained, the current can be estimated for the time (either future or past) of an actual voltage measurement. A reading of the two simultaneously could be critically more expensive, particularly when costs must be kept to an absolute minimum. Thus the pseudo current and voltage can be measured quite independently and still yield results as though simultaneous readings had been taken. In this arrangement, the current is computed for several milliseconds ahead or recently behind, at a time when a voltage reading is to be or was taken. When the voltage reading or readings actually take place, it and the pseudo or calculated future or past current or currents are treated as simultaneous readings in the power calculation. If the voltage readings are taken first, they are stored, along with the appropriate time. When the currents have been computed for the corresponding voltage times the voltage readings are taken from storage, and, treating the voltage and current as simultaneous readings, the power is calculated.

There is more than one way to compute the energy consumed with the digital meter of the present invention while still following the teachings thereof. For example, unlike the calculation method set forth hereinbefore, not only does the current and voltage not have to be measured simultaneously but in addition, it is not required in an alternative embodiment that one be computed for the time of occurrance of the measurement of the other. In otherwords, it is not even always necessary in an alternative embodiment to, for example, compute an estimated future or recent past value or values of the approximated current, as expressed in an algorithmic series, for a selected future or recent past voltage reading time or times.

As an alternative, the energy consumption may also be obtained by expressing or also representing the voltage pickup measurement in an algorithmic series for expressing cyclic phenmema (as is done also for the magnetic field pickup expressing the time derivitive of the current flow), and then the micro computer or micro processor (computer means) is further programmed to separately multiply the coefficients of sines and the coefficients of cosines for each harmonic in the current derivative and voltage algorithmic series expressions. The coefficients of the sine series representing voltage are multiplied by the coefficients of the cosine series representing current derivative. The coefficients of the cosine series representing voltage are multiplied by the negative of the coefficients of the sine series representing current. These are summed harmonic by harmonic and are divided by the harmonic number. Thereafter a step of summing is carried out by summing the above described results and dividing the sum in half, to give a number value proportional to the energy consumed through the conductors.

The algorithmic or Fourier coefficients may be obtained in real time by a series of adjustments using the new feedback technique previously discussed. The readings of rate of change of the magnetic field (current derivative), when taken, are compared to those computed from the algorithmic or Fourier series. The deviation of the computed results from the actual current derivative readings are noted. These deviations are the basis of the adjustments which are made to reduce them. As a result of not including higher harmonics, the calculated derivative value will be in error. This error will show up as noise. It will cause a fluctuation of Fourier component magnitude, but will not result in an accumulated error in the summations. The error wanders plus and minus and accordingly tends to cancel itself. In other words the error is in both directions and in the end result cancels itself for all practical purposes.

As previously noted group readings may be made as opposed to single readings. When adjustments are made for a group of readings rather than just one, and if the number of readings in a group is not very large, the adjustment system will not converge to stable values even if the situation is stable and free of noise. Instead the values computed for current will hunt around the correct value. The integral of power over time will not be substantially influenced by these "wandering" errors.

Also, as an alternative to simplify calculations, the values of the time derivative of the magnetic field already computed can be assumed to be zero for this comparison process such that this new group of readings is used directly to obtain new coefficients of the algorithmic series, as would be the case in start-up.

The measurements of magnetic field rate of change (current derivative) are taken at frequent, though not necessarily at equal intervals. After each reading, or group of readings, adjustments may be made to each of several coefficients of the algorithmic or Fourier series. Thus the algorithm must determine how much of each correction is to be attributed to each coefficient.

It is also desirable to filter out unwanted noise from the magnetic field pickup (time derivitive of the current flow) and the voltage pickup in order to remove noise that could otherwise interfere with proper metering functions. To accomplish this, these two pickup signals are filtered either with passive or active filters. Examples of passive filters which might be used would be simple RC circuits or diode clippers. Obviously a combination of such elements may also be employed.

When filtering the voltage and magnetic field pickups, they are filtered to give identical phase shifts. Thereafter, the aforedescribed computations are carried out wherein algorithmic or Fourier expansion is carried out on the magnetic field pickup, or on both the magnetic field pickup and the voltage pickup output.

If the algorithmic or Fourier expansion is performed only on the magnetic field pickup, thereafter each magnetic pickup harmonic coefficient is multiplied by the appropriate factor to correct for both magnetic pickup attenuation and that of the corresponding voltage pickup attenuation, and then the process is continued as previously explained.

When the voltage pickup and the magnetic field pickup are filtered with yielding identical phase shifts and attenuation filters hereinafter called identical filters, the algorithmic or Fourier expansion may then be preformed on this output, and thereafter the voltage and magnetic pickup output harmonics are each multiplied by the factors to compensate for the known attenuation to which each has been subject, and then the process continues as previously explained.

As a further alternative, after the meter inputs are filtered with identical filters, the outputs for each harmonic involved may be divided by the attenuation factor for that harmonic, after which the process continues as previously explained.

As a further example of filtering, the voltage pickup and magnetic field pickup may be filtered to give identical phase shifts and then the algorithmic or Fourier expansion is performed on the magnetic pickup output only. Thereafter each magnetic pickup harmonic coefficient is divided by the square of its attenuation to correct for both it and the corresponding voltage pickup which, has not been put or placed in harmonic algorithmic form. Thereafter the computing process is continued as previously explained in order to obtain the energy consumption reading.

It is desirable that the timing of pseudo current and voltage measurements be independent of the zero crossing (of voltage or current) of the actual power system. If the timing is generated electronically, the cycle lengths of the fundamental and all harmonics will not coincide with the acutal lengths in the power system. This will cause some slight, but continuous phase shift as time goes on. With the adjustment processes proposed, this is no problem, but high harmonics, which possibly adjust the slowest, will also shift phase the fastest. Though precision is desirable, a timing accuracy of 1/20,000 would probably be adequate for metering purposes. In those cases where time of day information is important, the micro computer can be reset once a month or so, automatically, when the meters are electronically read for billing purposes. The 1/20,000 would then produce an error in start and stop of load times of about two minutes maximum. Greater accuracy, however, is very inexpensive.

The measurements of the magnetic field rate of change are preferrably made with a small coil on a bobbin, which in turn is provided with a ferromagnetic material core. The ferromagnetic material core, is best made of a material of low retentivity such as a molded ferrite material of the type used in portable radio antennas, and passes around the conductor from which the current is to be determined. As previously noted, this core passes through the bobbin. The core also must be designed such that it never becomes even close to magnetic saturation. To accomplish this, it may in fact have one or more air gaps in it as high permeability is not called for. It must, however, have a very low reluctance as stated above.

The core of the ferromagnetic pickup displays a hysteresis loop the width of which requires a magneto-motive force of perhaps sixteen ampere-turns per meter of the cores magnetic length to overcome. With a magnetic path of 6 cm long, it will require about one ampere turn for overcoming the retentivity. In order to avoid loss of response to low current loads and to permit the use of an eight bit A/D converter (ten bit accuracy is probably needed, but eight bit A/D converters can be used in ways to obtain this accuracy). An additional coil is added to the bobbin used for the derivative current pickup. This coil, driven by an added oscillator operating at about 2000 Hz (not a harmonic of 60 Hz) produces about 0.1 ampere turn magneto-motive force, such as in a sawtoothed wave, to overcome this magnetic retentivity. This would also add a 2000 Hz signal of small magnitude to the pickup voltage.

This added voltage in the pickup coil should preferably be of magnitude of about 1/32 of the voltage pickup for the full scale reading (in a power system this would be about 2.82 times the nominal full scale reading).

If it is supposed the true signal going into a 0-5 volt A/D converter is only 0.01 V it would read zero at all times whereas with the added signal discussed above each digitized value will be nearly that appropriate to the small added signal wave. The voltage will be modulated by the actual signal so that though the average readings over a small time span (on a 60 Hz basis) for the added signal alone would be about zero, it will now be about the true value of the signal. Thus statistically we will now read a meaningful value for the true signal.

Thus the added accurrent signal imposed on the added coil will both remove the magnetic problem and will supply the small superimposed signal for increased precision.

BRIEF DESCRIPTION OF THE DRAWING

Other objects and advantages appear in the following description and claims.

The accompanying drawings show, for the purpose of exemplification, without limiting the invention or the claims thereto, certain practical embodiments illustrating the principals of this invention, wherein:

FIG. 2 is a combination schematic block diagram and flow diagram showing a variation in the programmed microprocessor of FIG. 1 illustrating another embodiment of the teachings of the present invention.

FIG. 3 is a schematic diagram illustrating one embodiment of the filter portion of the apparatus shown in FIG. 2.

FIG. 4 is a schematic diagram illustrating another embodiment of the filter portion of the apparatus shown in FIG. 2.

FIG. 5 is a schematic diagram illustrating a modification of the magnetic field rate of change pick-ups shown in FIG. 1.

DESCRIPTION OF THE PREFERRED EMBODIMENTS

Figure 1:
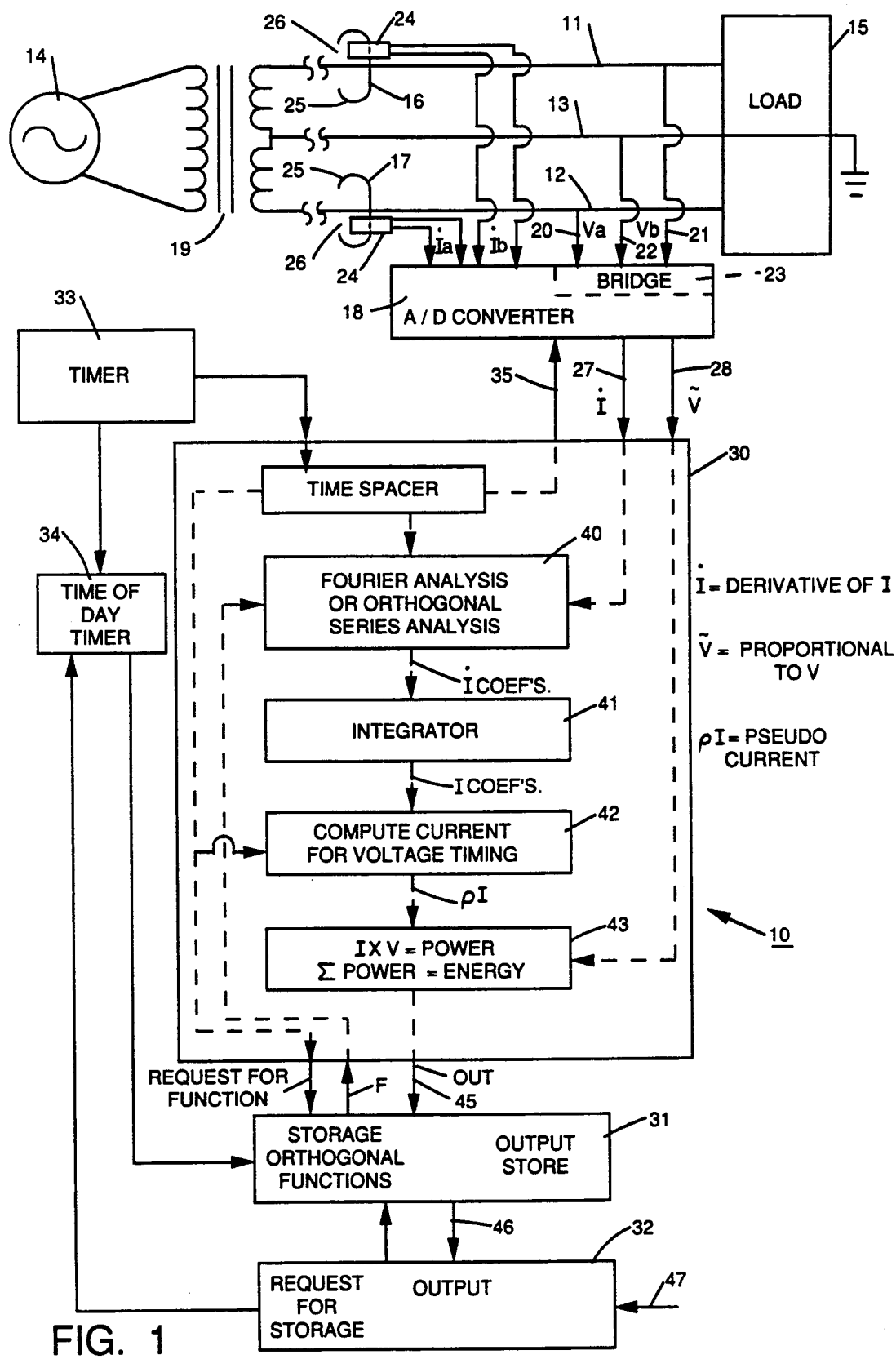
FIG. 1 is a combination schematic block diagram and flow diagram illustrating one embodiment of the teachings of the method and apparatus of the present invention.

Referring to the drawing, the electrical energy consumption meter of the present invention is generally indicated at 10 and measures electrical energy consumption from a plurality of transmission line conductors 11, 12 and 13 carrying an alternating current supplied from an alternating current source 14 through a transformer 19. In this particular illustrated embodiment of the present invention transformer 19 acts as a three wire single phase source positioned at a remote location. It should particularly be noted that the output of a transformer has no dc voltage component. Of course, the method and apparatus of the present invention will work equally well with a two wire, single phase or any multiple phase current source.

The transmission line consisting of conductors 11, 12 and 13 is indicated as being connected to an electrical load 15, which may be any conventional load having resistive, inductive, and capacitive characteristics and which may also include nonlinear elements such as semi-conductor controlled loads. Middle conductor 13 is indicated as being the ground return for this single phase three wire system.

The energy consumption for digital watt-hour meter 10 of the present invention will be described with reference to the figure starting with the transmission line sensors. Two magnetic field rate of change pick-ups 16 and 17 are provided for measuring the time derivative of the magnetic field induced by the electrical current flowing in transmission line conductors 11 and 12 respectively. These pick-ups, along with any needed analog preamplifiers, accordingly provide a reading proportional to the time derivative of the current flow to analog digital converter 18 and these respective derivatives of the currents are indicated as $\dot{I}a$ and $\dot{I}b$.

The current derivative pick-ups 16 and 17 each consist of a pick-up wire coil wound about a bobbin, as indicated at 24, having a core 25, preferably of ferromagnetic material, which respectively pass around conductors 11 and 12. This ferromagnetic core could be made of materials such as molded ferrite used in portable radios. These cores 25 are designed so that they never come even close to magnetic saturation and they may be provided with respective air gaps 26 as high permeability is not called for. They should have very low coercivity.

Means for measuring voltage from the transmission line conductors is also provided in the form of voltage tap lines 20, 21 and 22 in combination with conventional resistor bridge 23, which in this instance is shown as part of analog digital converter 18. This conventional voltage measuring means measures voltages of Va and Vb of conductors 12 and 11 respectively with reference to ground conductor 13.

The analog value of voltage and the analog measurement of the magnetic field rate of change or current derivative are both converted to digital readings in a conventional manner by the analog to digital converter thereby providing outputs 27 and 28 of the derivative of the current, indicated as $\dot{I}$, and a voltage output $\tilde{V}$ which are respectively porportionate to the derivative of the current and to the voltage on the transmission line. The proportionality constants must be known and must be very stable.

Timing for the analog to digital converter is provided by microprocessor 30 at terminal 35. The digital watt-hour meter 10 utilizes a computer or computer means for calculating and providing output measurements and this computer may be said to generally consist of analog to digital converter 18, microprocessor 30, register 31, input/output terminal 32, timer 33 and time of day timer 34.

Microprocessor 30 is a custom chip, but a conventional microprocessor chip which is programmed for first representing the current derivative $\dot{I}$ with an algorithmic series for expressing cyclic phenomena may be used. In this instance a low order Fourier series is selected for this purpose. This function of microprocessor 30 is indicated at stage 40 in the flow chart portion of the drawing.

At stage 41 this low order Fourier series representation of the current derivative is integrated to provide an approximate mathematical representation of the current I flowing in the transmission line. Then the microprocessor 30 is further programmed such that in stage 42 of the flow chart an estimated future or an estimated recent past value of this approximated current is computed or calculated in the Fourier series for a selected future or recent past voltage reading time. In other words, if this computed current is to be used to represent instantaneous current for a voltage reading already taken, then it will be computed for the time at which that voltage reading was previously taken. If it is to represent a future current reading for a voltage reading to be taken at a selected future time, then the current is computed for that future voltage reading time. This computed and approximated current for a selected or given future or past time is generally referred to as a pseudo current indicated as pI, as it is not the true instantaneous current.

Then the microprocessor 30 is further programmed such that in stage 43 of the flow diagram the voltage measured at the selected time or times is multiplied by the corresponding future or recent past pseudo current or currents and the result is summed, thereby obtaining a measurement output number value at terminal 45 which is proportional to the kilowatt hours consumed by load 15 on the transmission line. This value is stored in memory register 31.

This kilowatt hour reading may also be transmitted as indicated at 46 to input/output terminal 32 via a conventional conductor, or by way of radio waves or telephone transmission lines or the like, if input/output terminal 32 is to be located at a remote location. Actual physical readings of the kilowatt hour consumption may be read from input/output terminal 32 as indicated at 47. This could be done by a meter reader either by use of a visual observation of meter displays or by electrical, optical, etc. coupling devices used to read the meter, or again this output could also be transmitted to a remote location for reading either visually or by another computer.

Microprocessor chip 30 may in addition be further programmed such that in stage 40 a Fourier series is adjusted by first comparing its computed current derivative reading with acutal readings from digital output 27, to one or more values thereof already computed and fed back to stage 40 from storage in register 31 through feedback line F thereby detecting the deviation of the computed from the actual magnetic field derivative current readings, and utilizing this deviation to accordingly adjust coefficients of the Fourier series for corrections. This comparison may also be done by summing deviations each with a weighting factor, and utilizing the sum of weighted deviations to accordingly adjust coefficients of the Fourier series for corrections.

Alternatively to the option of the above paragraph, microprocessor chip 30 may be further programmed such that in stage 40 a Fourier series is constructed to best fit the readings from digital output 27. This is like the above paragraph except that no comparison is made and is in fact the necessary start-up condition for the situation in the above paragraph. The construction is accomplished by weighting each measurement individually for each coefficient. The weighting factor in the case of the Fourier series construction includes the corresponding sine or cosine function.

Microprocessor 30 may alternatively be further programmed such that a group of readings of the time derivative of the magnetic field is taken at stage 40, as opposed to just one reading, and when this group of readings is compared to values already computed, the coefficients are adjusted to get a better fit or the group of readings is used directly to obtain new coefficients of the Fourier series from scratch as in the above paragraph for a single reading or as would be the case here in conditions of start-up. The preferred situation, as fewer computations are needed, is the direct computation of coefficients without comparison as is done when the meter is in a start-up condition. This greatly, and perhaps even critically, reduces computation time.

The computing process may also be further simplified by eliminating even harmonic and/or high frequency harmonics, and possibly all harmonics where the index is an integral multiple of 3, in the Fourier series representing the current wave form.

By way of illustration, two means of feedback correction are illustrated hereinafter, the first one in the form of a description of a program and the second in the form of a typical computer program which might be utilized in microprocessor 30. The first equations illustrate one possible way of making these adjustments and the variables have the following meaning:

| | |
|---|---|
| dJ(t) | The rate of change of primary current as measured by a pickup coil in the magnetic field around the conductor at time t. |
| scdcomp | The sum of components of the Fourier series which is to represent this rate of change. |
| t | Time in units of electrical radians, about 2.65 milliseconds. |
| n | index of harmonic. |
| as[n] | The coefficient of the nth sine term in the derivative series. |
| ac[n] | The coefficient of the nth cosine term in the derivative series. |
| del | Deviation between measurement and computation of magnetic rate of change pick-up. |
| Jc | Computed current (proportional factor missing). |
| m | Highest component in series considered. |
| delas[] and delac[] | are incremental amounts to be used in correction of as[] and ac[] respectively. |

And mm is a damping factor to prevent corrections from being too large.
The correction.
The series is then:

$$scdcomp = \sum_{n=1}^{n=m} [as[n]\sin(nt) + ac[n]\cos(nt)]$$

$$del = dJ(t) - scdcomp$$

Positive del indicates that the computed value was too small. At the start of each group (or individual reading) the delas[ ] and delac[ ] terms are set to zero. Adjustments are initiated after each reading.

$$delas[n] = del^*\sin(nt) \quad \text{(accumulated sum)}$$
$$delac[n] = del^*ws(nt) \quad \text{(accumulated sum)}$$

Or, in case of a group of readings, the equations are different and are:

$$delas[n] = delas[n] + del^* \sin(nt)$$

$$delac[n] = delac[n] + del^* \cos(nt)$$

The sine and cosine factors insure that terms contributing to the total current are adjusted proportional to their contribution and that the sign of the correction is proper.

At completion of each reading or group of readings, the adjustments to the coefficients are made.

$as[n] = as[n] + delas[n]*mm$ (accumulated sum)

$ac[n] = ac[n] + delac[n]*mm$ (accumulated sum)

Now the 'integration' takes place. Minus cosine is substituted for sine, and sine is substituted for cosine, and a division is made by the harmonic number.

$$Jc = \sum_{n=1}^{n=m} [as[n](-\cos(nt)) + ac[n]\sin(nt)]/n$$

This current value can be obtained for any time in the cycle, not just when readings are taken. They should be computed for the instants of taking the voltage readings so that instantaneous power can be determined. The instantaneous power is $V \times Jc$ where V is the voltage measured at time t.

The sine for values for a ¼ cycle could be in a look up table. This would do for all sines and cosines of the fundamental and all harmonics.

The second method, involving one or a group of readings, is illustrated below as a segment of a BASIC program. The description (slashed lines) refer to the numbered line in the program or to the lines immediately above.

| | |
|---|---|
| 1 | w = pi/256 |
| /// | In 1, pi is the usual 3.14159265. |
| 2 | ml = 32 |
| /// | In 2, ml is the number of readings in one group - before |
| /// | corrections are made. It might be as small as 1 in which case |
| /// | the means of spacing readings shown is inappropriate. |
| /// | In 3 & 4, t is the time measured in units of 1/512 of an electrical |
| /// | cycle. |
| 3 | t = t + 33 |
| /// | This indicates t + 33 replaces t, or t is incremented by 33 after each |
| /// | group of cycles, (33/512 cycles). |
| 4 | nb = t mod 512 |
| /// | nb is measured from the 'beginning' of each cycle. |
| /// | It is important to note that the cycle is in phase with the |
| /// | actual electrical cycles BY CHANCE ONLY. Such alignment has no |
| /// | role in the instrument operation. |
| 5 | for m = 1 to ml |
| /// | Start of a group readings of the magnetic field derivative. |
| 6 | if m mod 2 = 0 then |
| /// | (if m is even) |
| 7 | delt = 401 |
| /// | (take the next reading 401/512 cycle later) |
| 8 | else |
| /// | (otherwise) |
| 9 | delt = 53 |
| /// | (take the next reading 53/512 cycles later) |
| 10 | end if |
| 11 | t = t + delt |
| /// | Lines 7 through 12 show that readings don't have to be evenly spaced. |
| 12 | nb = t mod 512 |
| /// | (only the phase of nb is important) |
| 13 | dJc = 0 |
| /// | dJc is the symbol for computed (Fourier Series) current derivative. |
| 14 | for n = 1 to 11 step 2 |
| /// | The 'step 2' above indicates that even harmonics are ignored here. |
| /// | Leaving out 'step 2' is arbitrary. If left out, even harmonics are |
| /// | computed. |
| 15 | dJc = dJc + ass(n)*sin(n*w*nb) + acc(n)*cos(n*w*nb) |
| /// | (adding harmonic components) |
| 16 | next n |
| /// | If computations are to obtain new coefficients with |
| /// | adjustments, lines 13 through 16 are left out and dJc = 0. |
| 17 | del = dJ(t) − dJc |
| /// | del is the deviation between measured (dJ(t)) and computed current |
| /// | derivative. In lines 18-21 dass () and dacc() are correction terms |
| /// | computed after each reading. |
| 18 | for n = 1 to 11 step 2 |
| 19 | dass(n) = dass(n) + del*sin(n*w*nb) |
| 20 | dacc(n) = dacc(n) + del*cos(n*w*nb) |
| 21 | next n |
| 22 | next m |
| /// | End of a group readings |
| 23 | for n = 1 to 11 step 2 |
| 24 | ass(n) = ass(n) + 2*dass(n)/ml |
| 25 | acc(n) = acc(n) + 2*dacc(n)/ml |
| /// | dass and dacc reset to zero for next group. |
| 26 | dass(n) = 0 |
| 27 | dacc(n) = 0 |
| 28 | next n |
| /// | New assignments of ass() and acc() after each group. |
| 29 | del = 0 |

| | |
|---|---|
| 30 | Jc = 0 |
| /// | Resets for del and Jc for next cycle. |
| /// | The integration of the series. |
| 31 | for n = 1 to 11 step 2 |
| 32 | Jc = Jc + (−ass(n)*cos(n*w*nb) + acc(n)*sin(n*w*nb))/n |
| 33 | next n |
| 34 | goto 3 |
| /// | Recycling |

As previously noted, it is desirable for a number of reasons that the timing of the pseudo current and voltage measurements be independent of the actual power system frequency. If the timing is generated electronically, the cycle lengths of the fundamental and all harmonics would not exactly coincide with the actual lengths in the power system. This will cause a slight but continuously increasing phase shift as time progresses. The actual time of day registered in time of day timer 34 can be reset at appropriate times such as once a month or so when the meters are read for billing purposes either at location or remotely.

In this aforedescribed computation procedure, the time derivative of the magnetic field pickup, as expressed with an algorithmic series for expressing clyclic phenomena, is approximated in value for a selected future or recent past voltage reading time, and then it is multiplied by that measurement of voltage or voltages, prior to the step of summing this power reading to obtain a number value proportional to the energy consumed through the conductors.

However, when following the teachings of the present invention, there are multiple ways in which the energy consumption can be computed, once the magnetic field pickup has been expressed as an algorithmic series for expressing cyclic phenomena or in the low order Fourier series, for example. For example, the current and voltage not only do not have to be measured simultaneously but as an additional example, one does not have to be computed for the time of occurance of the measurement of the other as was previously expressed in the example of FIG. 1. One alternative example of computation is illustrated in FIG. 2.

In general, energy delivered can be expressed mathematically as the intregal of instaneous current times the simultaneously taken instantaneous voltage. When each of these are expressed as Fourier series, it is seen that all cross terms (between frequencies) in the product drop out. Furthermore, the voltage wave form as delivered by the power company transformer remains much more nearly sinusoidal, not being distorted by the various loads on the system nearly as much as the current wave form.

Thus the voltage wave form contains only small harmonic content and no direct current component. The even harmonics of power are no doubt low as they are the result of imbalance between the two halves of both the voltage and current wave. The required precision therefore does not necessarily require inclusion of even harmonics in the current wave form, and the analysis is clearly somewhat simplified if they are left out. Also almost no power systems deliver third harmonic power or any harmonic of the third harmonic (3, 6, 9, etc). These also can be left out for the instruments on those systems.

Because of these considerations, no attempt need be made to duplicate the high frequency found in the current in many applications. Because the high frequency component of the voltage is very much smaller, no high frequency need be computed for the current wave form. Accordingly, if no high harmonics are needed in the current wave form, none are needed in the derivative wave form. That is, the algorithmic or Fourier series describing the pickup voltage need have no high harmonic content in spite of the obvious high harmonic content that may appear in the pickup voltage.

When the analytic expression for both current and voltage are obtained, the coefficients of sines and separately the coefficients of cosines for each harmonic in the current and voltage expressions are multiplied, then their sum is divided by two. In the example shown, readings of the changing magnetic field are made so that time gaps are produced during which voltage readings and readings on a second line, as well as various calculations of current and power can be performed.

The current may be expressed as $$I = a1^* \sin(wt) + a3^* \sin(3wt) + a5^* \sin(5wt) + + + + b1^* \cos(wt) + b3^* \cos(3wt) + b5^* \cos(5wt) + + +$$

The voltage as $$V = A1^* \sin(wt) + A3^* \sin(3wt) + A5^* \sin(5wt) + + + + B1^* \cos(wt) + B3^* \cos(3wt) + B5^* \cos(5wt) + + +$$

The Fourier coefficients for the current are obtained in real time by a series of adjustments using one of the techniques of the disclosure for FIG. 1. For the current the technique is the same as that used in the disclosure for FIG. 1 for the derivative of the current.

The power is then $$\text{Power} = [a1^*A1 + b1^*B1 + a3^*A3 + b3^*B3 + a5^*A5 + b5^*B5 + + +]/2$$

Note in particular that no current per se is computed.

Note further that the current coefficients were derived simply from current derivative coefficients which could have been used directly with proper sign and harmonic adjustment. Then not even the current coefficients would be computed.

Referring specifically to FIG. 2, this latter method of computation is illustrated. Like elements are designated with the same reference numerals. Only the modified portion of the apparatus illustrated in FIG. 1 is shown. This was done for simplification as it is not necessary to reproduce the entire circuit of FIG. 1 for the purpose of illustration.

In this alternative design, the microprocessor 30 is programmed to make the computation of energy consumption in a different manner, while still following the teachings of the present invention. Instead of merely making a Fourier analysis of the current derivative İ, Fourier analysis is conducted not only on the magnetic pickup (current derivative), but also on the voltage pickup, as indicated at stage 50 in the flow chart portion of FIG. 2 and as discussed in the case above. Thus, the voltage measurement as well as the magnetic field pickup is represented in an algorithmic series for expressing cyclic phenomena.

Then as shown in stage 51, the microprocessor is programmed to separately multiply the negative of the voltage coefficients of sines by the current derivative coefficient of cosines and the coefficients of cosines by the coefficient of current derivative coefficients of sines of each harmonic in the current derivative and the voltage algorithmic series for Fourier expression. Each harmonic product is divided by twice the harmonic index which accordingly gives an expression of power. Thereafter, as illustrated in the last stage 52, these multiplication results are divided by twice the harmonic index then summed to provide an output measurement proportional to the value of the energy consumed through the original conductors. Thereafter the error correction and the averaging of functions may be carried out in the same manner as was done in regard to the illustrations of FIG. 1.

The digital power meter of the present invention involves Fourier expansion and permits a simple means of filtering without loss of information or accuracy or the introduction of any power factor error. Such filtering is advantageous as it can remove noise that could otherwise interfere with proper metering function. Acceptable methods of filtering are described hereinafter.

The filter may be an analog filter consisting only of elements such as capacitors, inductors or resistors, which are used in the magnetic pickup circuit used to determine current. A filter with identical frequency dependence of attenuation and phase shift would also be used on the voltage pickup. As a result the harmonics of both signals are identically phase shifted and attenuated. When the harmonic coefficients are multiplied, only the attenuation will be involved in determining the power magnitude as no change of power factor will result for the fundamental or for any of its harmonics.

With a known filter arrangement the attenuation for each harmonic will be known. Let the h harmonic attenuation $=Ah$. Then the contribution of the h harmonic to power will be effectively attenuated by the multiplier $(Ah)^2$.

When power is determined by multiplying the harmonic amplitudes, the product of the h harmonic is divided by this effective attenuation, the square of the individual attenuations. This restores its proper magnitude.

When a pseudo current is computed and is multiplied by the attenuated voltage, each current harmonic contribution is divided by $(Ah)^2$. The squared value is to compensate for the attenuation of both the current and the voltage, the latter of which, in this case, is not expressed as a Fourier series.

Additionally, diode clippers may also be employed in a conventional manner to cancel noise at the pickup outputs.

The filter for the voltage and current must have identical phase shifting characteristics. That is, the phase shift for the fundamental must be the same for both filters as must the various phase shifts for each of the relevant harmonics individually. This implies that the attenuation of both the current derivative and voltage will be equal, harmonic by harmonic. This does not imply that the hardware structure of the filters must be identical.

The simplest filter that will remove high frequencies moderately well is the simple R-C filter consisting of a resistor structure and a capacitor. The resistor structure may be a resistor network or a simple resistor. Two filters are identical for this purpose if they have the same RC product, where R is the effective resistance of the network.

The attenuation, A, of an R-C filter is given in terms of T, the RC product which has the dimensions of time and is the R-C filter time constant:

$$A=1/\mathrm{sqrt}[1+(wT)^2]$$

Where w is the angular frequency, or $2\times\mathrm{pi}\times\mathrm{ff}\times\mathrm{n}$, where $\mathrm{pi}=3.14159$, ff is the fundamental frequency, 60 (Hz) for example, and n is the harmonic. Thus the voltage filter and the current derivative filter must have the same time constants. As a result, the indicated power associated with each harmonic will be diminished by the square of this attenuation.

As an example, the embodiment of FIG. 2 illustrates the addition of filter 52 at the voltage pickup output and filter 52' at the magnetic field pickup. These filters are illustrated in detail in FIG. 3. The voltage filter consists of a simple R-C construction consisting of two resistors in series with a capacitor across one of them. As seen, the resistors are designated as R1 (the high voltage contact resistor) and R2 (the resistor associated with the common line 13) and the capacitor is designated as C1. The effective resistance of the two resistors in the filter is their product divided by their sum. Thus the effective filter resistance R, is given by $R=R1*R2/[R1+R2]$.

The simple series voltage divider involved produces a dc output voltage equal to the input voltage times $R2/[R1+R2]$. Attenuation in this context refers to reduction of this output value by the addition of the capacitor. The output of this filter is taken at the junction of R1, R2 and capacitor C1.

The current derivative signal might best be filtered between two stages of amplification. The filter could be a simple RC filter using one resistor, Ri, in series with a capacitor C2 as shown in FIG. 4. The output of this stage of the filter (and input to the next stage of amplification) is the junction of the resistor and the capacitor.

The filtered voltage and current derivative signals are treated as discussed in the earlier disclosures. The output for each frequency is compensated for its attenuation by multiplying it by $$M=1+(wT)^2,$$

the inverse of $A^2$.

In case the voltage isn't put into Fourier series form, the current is computed using this multiplier for each harmonic. (Note that its value is harmonic dependent.) If the harmonic amplitudes of the voltage and current are multiplied together, each harmonic product is multiplied by its corresponding factor before proceeding.

As an example, for $T=0.53052$ ms for a 60 Hz system, the values of wT for the fundamental and the 3, 5, 7, 9, 11 harmonics are:

| Harmonic | Frequency | wT  | M(ultiplier) |
|----------|-----------|-----|--------------|
| 1        | 60 Hz     | .2  | 1.04         |
| 3        | 180       | .6  | 1.36         |
| 5        | 300       | 1.0 | 2.0          |
| 7        | 420       | 1.4 | 2.96         |
| 9        | 540       | 1.8 | 4.24         |

-continued

| Harmonic | Frequency | wT | M(ultiplier) |
|---|---|---|---|
| 11 | 660 | 2.2 | 5.84 |

The principles and techniques discussed above can readily be used to construct an all digital simulation of a nonsaturating current transformer suitable for control purposes. Both odd and even harmonics should be used. The number of harmonics is somewhat arbitrary, but conventional current transformers indicate nothing but low harmonics.

A magnetic field pickup is used just as one is used on the digital power meter for the measurement of rate of change of current. This ferromagnetic loop, as previously has gaps built into it. To make sure that it won't saturate in any position, many gaps, perhaps as many as 16, are used. In power line distribution control systems, where very large currents are involved, this large number of gaps should not produce a problem. By having a multitude of gaps, no segment of ferromagnetic material will be long enough to approach saturation in even the worst geomagnetic storms.

The output of the pickup coil may be filtered with linear filters or with diode clippers for cutting off extra high peaks. The Fourier coefficients are obtained for all low frequency harmonics. The integration is performed as previously discussed, interchanging sine and cosine coefficients, dividing by the harmonic number, reversing the sign of the sine coefficients in the integrated current series, and phase shifting appropriate to the filter and correcting for filter attenuation. The only added ingredient here is the phase correction shifting which uses simple trigonometric relations and is carried out on the microprocessor portion of the meter.

If no filter is involved, then no attenuation or phase shift correction are needed. [The diode clipper does not introduce errors that need correction.]

The phase shift produced by the filter should be known for all harmonics (frequency dependent only). For example, if the phase shift for the nth harmonic was 2*pi/12 radians [a delay of 30 degrees], it will be necessary to correct this phase shift. Let aS and bC be the observed sine and cosine coefficients for this nth harmonic. Then its phase would be $$\arctan(aS/bC)$$

This must be "advanced" by the known delay for that harmonic. "Advanced" corresponds to a negative phase shift. The sine of −2*pi/12 radians is −0.5 and its cosine is +0.866. Then the corrected phases (indicated by primes) would be $$aS = -0.5*bC \times 0.866*aS$$

$$bC = +0.866*bC + 0.5*aS$$

The current wave form would be computed using this corrected phase along with the corresponding corrected magnitudes for the fundamental (harmonic #1) and the harmonics.

The cores 25 of the respective ferromagnetic pickups 16 and 17 display a hysteresis loop, the width of which requires a magneto-motive force of perhaps sixteen ampere-turns per meter of the cores magnetic length to overcome. Accordingly, it is desirable to avoid loss of response to low current loads and to permit also the use of an eight bit anolog-to-digital (A/D) converter. Ten bit accuracy is no doubt preferable, but eight bit converters are much less expensive.

In order to overcome this problem, a coil of fifty or sixty turns may be added to the bobbin used for the derivative current pickup coil 24 and through this coil a magneto-motive force is imposed on the ferromagnetic core 25 with a frequency which is not a harmonic of the frequency of the alternating current carried by the conductor 11 or 12, thereby removing effects of core retentivity. This improvement is illustrated in FIG. 5.

Referring specifically to FIG. 5, this added coil of, for example, fifty or sixty turns is indicated at 60 and is added to the same bobbin (not shown) used for the derivative current pickup coil 24. Coil 60 is driven by an added oscillator 61 operating for example at about 2000 Hz. This oscillator frequency must be selected such that it is not a harmonic of 60 Hz or a harmonic of the frequency of the alternating current carried by conductor 11. Other than this requirement, the frequency is not critical. This produces about a 0.1 amphere-turn magneto-force on the ferromagnetic core 25, which for example may be in the form of a sawtoothed wave, to overcome the magnetic retentivity.

Given a magnetic path of say 6 cm it will require about one ampere-turn for overcoming the retentivity. This of course will also add a 2000 Hz signal of small magnitude to the pickup voltage.

The magnitude of this magneto-motive force is small compared to the full scale magnitude of the measured time derivative of the magnetic field. For example, this added voltage in the pickup coil should preferably be of a magnitude of about 1/32 of the voltage pickup for the nominal full scale reading. In a power system this would be about 2.82 times the full scale reading.

By way of example suppose that the signal going into a 0-5 volt A/D converter is only 0.01 V, it would read zero at all times whereas with the added signal discussed above for each digitized value will be nearly that appropriate to the small added signal wave. The voltage will be modulated by the actual signal so that though the average readings over a small time span for the added signal alone would be about zero, it will now be about the true value of the signal. Thus statistically one reads a meaningful value for the true signal.

This added alternating current signal imposed on the added coil will both remove the magnetic problem and will also supply the small superimposed signal for increased precision.

I claim:

1. The method of measuring electrical energy consumption from a plurality of transmission line conductors carrying alternating current, comprising the steps of, measuring the time derivative of the magnetic field induced by an electrical current flowing in a transmission line conductor thereby obtaining a reading proportional to the time derivative of the current flow, mathematically approximating the time derivative of the current flowing in the conductor by expressing said magnetic field rate of change with an algorithmic series for expressing cyclic phenomena, measuring the voltage between conductors of the transmission line, computing an approximation of the power being consumed through the transmission line by converting the time derivative of the current as expressed in an algorithmic series and the voltage measurement mathematically to a power reading, and summing the power reading to obtain a number value proportional to the energy consumed through said conductors.

2. The method of claim 1 wherein said algorithmic series is a low order Fourier series.

3. The method of claim 2 including the step of converting the measurement of the time derivative of the magnetic field to digital value prior to the step of mathematically approximating.

4. The method of claim 1 wherein the step of computing an approximation of the power includes the steps of, integrating said algorithmic representation to obtain a representation of the current, computing an estimat future or recent past value or values of said approximated current in said algorithmic series for a selected future or recent past voltage reading time or times, measuring said voltage at said selected future or recent past time or times, and multiplying said measurement of voltage or voltages and future or recent past current or currents.

5. The method of claim 1 including the step of comparing an algorithmic series reading or group of readings of the derivative of the magnetic field around said conductor, when taken, to one or more values thereof already computed and thereby detecting the deviation of the computed from actual magnetic field derivative current readings, and utilizing said deviation to accordingly adjust coefficients of the algorithmic series for corrections.

6. The method of claim 5 wherein the step of comparing is characterized in that a group of said readings of the time derivative of the magnetic field and said value or values already computed are assumed to be zero for the purposes of said comparison such that said group of readings is used directly to obtain new coefficients of the algorithmic series.

7. The method of claim 5 wherein said algorithmic series is a low order Fourier series.

8. The method of claim 4 wherein said algorithmic series is a Fourier series.

9. The method of claim 8 wherein the step of mathematically approximating the current flowing in the conductor by representing said time derivative of the magnetic field with a Fourier series includes the step of eliminating even harmonics in the series representing the current wave form.

10. The method of claim 8 wherein the step of mathematically approximating the current flowing in the conductor by representing said time derivative of the magnetic field with a Fourier series includes the step of eliminating high frequency harmonics in the series representing the current wave form.

11. The method of claim 1 including the step of comparing an algorithmic series reading or group of readings of the time derivative of the magnetic field around said conductor, when taken, to the value or values thereof already computed, summing deviations each with a weighting factor, and utilizing said sum of weighted deviations to accordingly adjust coefficients of the algorithmic series for corrections.

12. The method of claim 11 wherein the step of comparing is characterized in that a group of said readings of the time derivative of the magnetic field and said value or values already computed are assumed to be zero for the purposes of said comparison such that said group of readings is used directly to obtain new coefficients of the algorithmic series.

13. The method of claim 2 wherein the step of computing an approximation of the power includes the steps of expressing said voltage measurement by representing it with a Fourier series, separately multiplying the coefficients of sines and the coefficients of cosines for each harmonic in the current and voltage algorithmic series expressions, and the step of summing includes the steps of summing the multiplication results and dividing the sum in half.

14. The method of claim 13 wherein said algorithmic series are low order Fourier series.

15. The method of claim 2 wherein the step of computing an approximation of the power includes the step of eliminating even harmonics in the Fourier series expression of the current derivative.

16. The method of claim 2 wherein the step of computing an approximation of the power includes the step of eliminating high harmonic content in the Fourier series expression of the current derivative.

17. The method of claim 13 including the step of filtering noise from the measurement of the time derivative of the current flow and from the voltage measurement to give identical phase shifts prior to the step of computing, and, after step of computing, multiplying each harmonic coefficient by the appropriate factor to correct for both the attenuation of the current derivative measurement and the attenuation of the corresponding voltage measurement.

18. The method of claim 13 including the step of filtering noise from the time derivative of the current flow measurement and the voltage measurement with filters to give identical phase shifts and attenuation prior to the step of computing, multiplying, the voltage output harmonics and the time derivative of the magnetic field output harmonics by factors required to compensate for the known attentuation to which each has been subjected as a result of said filtering.

19. The method of claim 18 wherein the step of multiplying each harmonic by the compensation factor comprises multiplication thereof by a reciprocal of the attenuation factor, thereby dividing each harmonic by the attenuation factor.

20. The method of claim 1 including the step of filtering noise from the measurement of the time derivative of the current flow and the voltage measurement to give identical phase shifts prior to the step of computing, and after the step of computing, dividing each algorithmic harmonic coefficient by the square of its attenuation to correct both the current derivative attenuation and the attenuation of the corresponding voltage measurement, which has not been put in harmonic form.

21. The method of claim 1 wherein the step of measuring the time derivative of the magnetic field includes the steps of utilizing a pick-up wire coil having a gapped ferromagnetic material core passing around the conductor and imposing a magneto-motive force on said core having a frequency which is not a harmonic of the frequency of the alternating current carried by said conductor, thereby removing effects of core retentivity.

22. The method of claim 21 wherein the magnitude of said magneto-motive force is small compared to the full scale magnitude of the measured time derivative of the magnetic field.

23. The method of claim 22 including the step of converting the measurement of the time derivative of the magnetic field to digital value prior to the step of mathematically approximating.

24. A digital electrical energy consumption meter for measuring electrical energy consumption from a plurality of transmission line conductors carrying alternating current comprising; a magnetic field rate of change pick-up adapted for measuring the time derivative of the magnetic field induced by an electrical current flowing in a transmission line conductor thereby obtaining a reading proportional to the time derivative of the current flow, and voltage pickup measuring means adapted to measure the voltage between conductors of the transmission line; computer means connected to said pick-up and to said voltage measuring means and programmed for representing said derivative of the current with an algorithmic series for expressing cyclic phenomena, for computing an approximation of the power being consumed by converting the time derivative of the current as expressed in an algorithmic series and the voltage measurement mathematically to a power reading, and for summing the power reading to thereby obtain a measurement number value proportional to the energy consumed by a load connected to the conductors.

25. The digital meter of claim 24 wherein said computer means is further programmed for integrating said algorithmic representation to provide an approximate mathematical representation of the current flowing in the conductor and for computing an estimated future or recent past value or values of said approximated current in said algorithmic series for a selected furture or recent past voltage reading time or times, for measuring the voltage with said voltage measuring means at said selected time or times and for multiplying said voltage or voltages and future or recent past approximated current or currents and summing the result.

26. The digital meter of claim 24 wherein said computer means is further programmed for comparing an algorithmic series reading or group of readings of the derivative of the magnetic field around the conductor, when taken, to one or more values thereof already computed, thereby detecting the deviation of computed from actual derivative current readings, and for utilizing said deviations to accordingly adjust the coefficients of the algorithmic series representing the current derivative for corrections.

27. The digital meter of claim 26 wherein said computer means is further programmed whereby a group of readings of rate of change of magnetic field around the conductor is taken and said value or values thereof previously computed are assumed to be zero for the purposes of said comparison such that said group of readings is used directly to obtain new coefficients of the algorithmic series.

28. The digital meter of claim 24 wherein said computer means is further programmed for: comparing an algorithmic series reading or group of readings of the time derivative of the magnetic field around the conductor, when taken, to the value or values thereof already computed, summing deviations each with a weighting factor, and utilizing said sum of weighted deviations to accordingly adjust coefficients of the algorithmic series for corrections.

29. The digital meter of claim 28 wherein said computer means is further programmed whereby a group of readings of rate of change of magnetic field around the conductor is taken and said value or values thereof already computed are assumed to be zero for the purposes of said comparison such that said group of readings is used directly to obtain new coefficients of the algorithmic series.

30. The digital meter of claim 24 wherein said algorithmic series is a low order Fourier series.

31. The digital meter of claim 25 wherein said algorithmic series is a Fourier series.

32. The digital meter of claim 31 wherein even harmonics of said Fourier series are omitted.

33. The digital meter of claim 31 wherein high frequency harmonics of said Fourier series are omitted.

34. The digital meter of claim 24 wherein said magnetic field rate of change pick-up comprises a pick-up wire coil having a ferromagnetic material core for passing around a conductor.

35. The digital meter of claim 34 wherein said core is provided with at least one gap therein.

36. The digital meter of claim 35 including means to impose a magneto-motive force on said ferromagnetic core having a frequency which is not a harmonic of the frequency of the alternating current carried by the conductor, thereby removing effects of core retentivity.

37. The digital meter of claim 36 wherein the magnitude of said magneto-motive force is small compared to the full scale magnitude of the measured time derivative of the magnetic field.

38. The digital meter of claim 37 including an analog to digital converter connected for converting said measurement of the time derivative of the magnetic field to a digital value.

39. The digital meter of claim 24 including an analog to digital converter connected for converting said measurement of the time derivative of the magnetic field to a digital value.

40. The digital meter of claim 24 wherein said computer means is further programmed for expressing said voltage measurement by representing it with an algorithmic series for expressing cyclic phenomena, for separately multiplying the coefficients of sines and the coefficients of cosines for each harmonic in the current and voltage algorithmic series expressions, and for summing the multiplication results and dividing the results in half.

41. The digital meter of claim 40 wherein said algorithmic series are low order Fourier series.

42. The digital meter of claim 24 wherein said algorithmic series is a Fourier series and said computer means is further programmed for eliminating even harmonics in the Fourier series expression of the current derivative.

43. The digital meter of claim 24 wherein said algorithmic series is a Fourier series and said computer means is further programmed for eliminating high frequency harmonic content in the Fourier series expression of the current derivative.

44. The digital meter of claim 40 including noise filter means connected for electronically filtering unwanted noise from said magnetic field rate of change pickup measurement and from said voltage pickup measurement with identical phase shifts, said computer means further programmed for multiplying each harmonic coefficient by the appropriate factor to correct for both the attenuation of the current derivative pickup measurement and the attenuation of the corresponding voltage pickup measurement.

45. The digital meter of claim 40 including identical noise filter means connected for electronically filtering unwanted noise from said magnetic rate of change pickup measurement and from said voltage pickup measurement respectively, said computer means further programmed for multiplying the voltage output harmonic coefficients and the time derivative of the magnetic field output harmonic coefficients by factors required to compensate for the known attenuation to which each has been subjected as a result of said filtering.

46. The digital meter of claim 45 wherein said multiplication factors consist of the reciprocal of the attenuation factor, said computer means thereby being programmed to divide each harmonic by the attenuation factor.

47. The digital meter of claim 24 including noise filter means connected for electronically filtering unwanted noise from said magnetic field rate of change pickup measurement and from said voltage pickup measurement with identical phase shifts, said computer means further programmed for dividing each harmonic coefficient by the square of its attenuation to correct both the magnetic field rate of change pickup attenuation and the attenuation of the corresponding voltage measurement, which has not been put in harmonic form.

* * * * *